United States Patent
Haba

(10) Patent No.: US 10,297,570 B2
(45) Date of Patent: *May 21, 2019

(54) 3D-JOINING OF MICROELECTRONIC COMPONENTS WITH CONDUCTIVELY SELF-ADJUSTING ANISOTROPIC MATRIX

(71) Applicant: Invensas Corporation, San Jose, CA (US)

(72) Inventor: Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/861,631

(22) Filed: Jan. 3, 2018

(65) Prior Publication Data
US 2018/0130766 A1    May 10, 2018

Related U.S. Application Data

(63) Continuation of application No. 15/257,427, filed on Sep. 6, 2016, now Pat. No. 9,871,014.
(Continued)

(51) Int. Cl.
*H01L 23/00* (2006.01)

(52) U.S. Cl.
CPC .............. *H01L 24/83* (2013.01); *H01L 24/05* (2013.01); *H01L 24/11* (2013.01); *H01L 24/13* (2013.01);
(Continued)

(58) Field of Classification Search
CPC .................................. H01L 24/83; H01L 24/13
See application file for complete search history.

(56) References Cited

U.S. PATENT DOCUMENTS 6,340,822 B1    1/2002  Brown et al.
8,399,982 B2 *  3/2013  Wyland .................. B82Y 10/00
                                                          257/698
(Continued)

OTHER PUBLICATIONS

Hiramatsu et al., "Aligned Growth of Single-Walled and Double-Walled Carbon Nanotube Films by Control of Catalyst Preparation," Ch. 10 of the Book: "Carbon Nanotubes—Synthesis, Characterization, Applications," edited by Siva Yellampalli, ISBN 978-953-307-497-9, 26 pages, Jul. 20, 2011.

*Primary Examiner* — Quoc D Hoang

(57) ABSTRACT

An adhesive with self-connecting interconnects is provided. The adhesive layer provides automatic 3D joining of microelectronic components with a conductively self-adjusting anisotropic matrix. In an implementation, the adhesive matrix automatically makes electrical connections between two surfaces that have opposing electrical contacts, and bonds the two surfaces together. Conductive members in the adhesive matrix are aligned to automatically establish electrical connections between at least partially aligned contacts on each of the two surfaces while providing nonconductive adhesion between parts of the two surfaces lacking aligned contacts. An example method includes forming an adhesive matrix between two surfaces to be joined, including conductive members anisotropically aligned in an adhesive medium, then pressing the two surfaces together to automatically connect corresponding electrical contacts that are at least partially aligned on the two surfaces. The adhesive medium in the matrix secures the two surfaces together.

20 Claims, 13 Drawing Sheets

Related U.S. Application Data

(60) Provisional application No. 62/215,727, filed on Sep. 8, 2015.

(52) U.S. Cl.
CPC .............. *H01L 24/14* (2013.01); *H01L 24/16* (2013.01); *H01L 24/27* (2013.01); *H01L 24/29* (2013.01); *H01L 24/32* (2013.01); *H01L 24/73* (2013.01); *H01L 24/92* (2013.01); *H01L 24/75* (2013.01); *H01L 24/81* (2013.01); *H01L 24/94* (2013.01); *H01L 2224/0401* (2013.01); *H01L 2224/056* (2013.01); *H01L 2224/0557* (2013.01); *H01L 2224/05573* (2013.01); *H01L 2224/05611* (2013.01); *H01L 2224/05616* (2013.01); *H01L 2224/05687* (2013.01); *H01L 2224/113* (2013.01); *H01L 2224/131* (2013.01); *H01L 2224/13022* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13193* (2013.01); *H01L 2224/1403* (2013.01); *H01L 2224/1601* (2013.01); *H01L 2224/16105* (2013.01); *H01L 2224/16146* (2013.01); *H01L 2224/271* (2013.01); *H01L 2224/2733* (2013.01); *H01L 2224/2741* (2013.01); *H01L 2224/27436* (2013.01); *H01L 2224/27849* (2013.01); *H01L 2224/29027* (2013.01); *H01L 2224/29028* (2013.01); *H01L 2224/2929* (2013.01); *H01L 2224/29291* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29393* (2013.01); *H01L 2224/29499* (2013.01); *H01L 2224/3201* (2013.01); *H01L 2224/32105* (2013.01); *H01L 2224/32145* (2013.01); *H01L 2224/73104* (2013.01); *H01L 2224/73204* (2013.01); *H01L 2224/75102* (2013.01); *H01L 2224/8109* (2013.01); *H01L 2224/81101* (2013.01); *H01L 2224/81191* (2013.01); *H01L 2224/81193* (2013.01); *H01L 2224/81203* (2013.01); *H01L 2224/81815* (2013.01); *H01L 2224/8309* (2013.01); *H01L 2224/8388* (2013.01); *H01L 2224/83101* (2013.01); *H01L 2224/83143* (2013.01); *H01L 2224/83193* (2013.01); *H01L 2224/83203* (2013.01); *H01L 2224/83815* (2013.01); *H01L 2224/83851* (2013.01); *H01L 2224/83862* (2013.01); *H01L 2224/9211* (2013.01); *H01L 2224/9212* (2013.01); *H01L 2224/92125* (2013.01); *H01L 2224/94* (2013.01); *H01L 2924/014* (2013.01); *H01L 2924/01006* (2013.01); *H01L 2924/381* (2013.01)

(56) References Cited

U.S. PATENT DOCUMENTS

| | | | |
|---|---|---|---|
| 9,362,143 B2 | 6/2016 | Sun et al. | |
| 9,871,014 B2 * | 1/2018 | Haba | ........................ H01L 24/83 |
| 2013/0092426 A1 * | 4/2013 | Wu | ........................ H01L 24/29 |
| | | | 174/257 |
| 2015/0017763 A1 | 1/2015 | Haba et al. | |

* cited by examiner

3D-JOINING OF MICROELECTRONIC COMPONENTS WITH CONDUCTIVELY SELF-ADJUSTING ANISOTROPIC MATRIX

RELATED APPLICATIONS

This continuation patent application claims the benefit of priority to U.S. patent application Ser. No. 15/257,427 to Haba et al., filed Sep. 6, 2016 and entitled, "3D-Joining of Microelectronic Components with Conductively Self-Adjusting Anisotropic Matrix," which in turn claims the benefit of priority to U.S. Provisional Patent Application No. 62/215,727 to Haba et al., filed Sep. 8, 2015 and entitled, "3D Joining of Microelectronic Components," both of these incorporated by reference herein, in their entireties.

BACKGROUND

Microelectronic elements such as semiconductor chips are commonly provided with elements that facilitate connection to other larger circuits. For example, a semiconductor chip is typically provided as a small, flat package having oppositely facing front and rear surfaces and contacts at the front surface. The contacts are electrically connected to numerous electronic circuit elements formed integrally within the chip.

Advances in semiconductor chip design and manufacture have led to semiconductor chips having a higher number and higher density of electrical contacts at finer and finer pitches. Such contacts on the chip may be joined by solder balls or other connectors to conductive elements on a facing surface of a motherboard, substrate, microelectronic assembly, another semiconductor chip, or larger package. Connecting high density contacts of such a microelectronic element to corresponding high density receiving elements on a facing surface can require a lot of precision, and cost investment as sometimes the contacts on surfaces of the microelectronic elements do not perfectly align with each other.

SUMMARY

An adhesive with self-connecting interconnects is provided. The adhesive layer provides automatic 3D joining of microelectronic components with a conductively self-adjusting anisotropic matrix. In an implementation, the adhesive matrix automatically makes electrical connections between two surfaces that have opposing electrical contacts, and bonds the two surfaces together. Conductive members in the adhesive matrix are aligned to automatically establish electrical connections between at least partially aligned contacts on each of the two surfaces while providing nonconductive adhesion between parts of the two surfaces lacking aligned contacts. An example method includes forming an adhesive matrix between two surfaces to be joined, including conductive members anisotropically aligned in an adhesive medium, then pressing the two surfaces together to automatically connect corresponding electrical contacts that are at least partially aligned on the two surfaces. The adhesive medium in the matrix secures the two surfaces together.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DESCRIPTION

This disclosure describes an adhesive with self-connecting interconnects. The adhesive layer provides automatic 3D joining of microelectronic components with a conductively self-adjusting anisotropic matrix. In an implementation, the adhesive matrix automatically makes electrical connections between two surfaces that have opposing electrical contacts, and bonds the two surfaces together.

In an implementation, a microelectronic package includes a die-to-die, die-to-wafer, or wafer-to-wafer interface between two components of the microelectronic package, an adhesive matrix to secure the interface together, and conductive carbon nanotubes or densely packed conductive wires in the adhesive matrix to establish electrical connections between at least partially aligned contacts of the two components.

Figure 1:
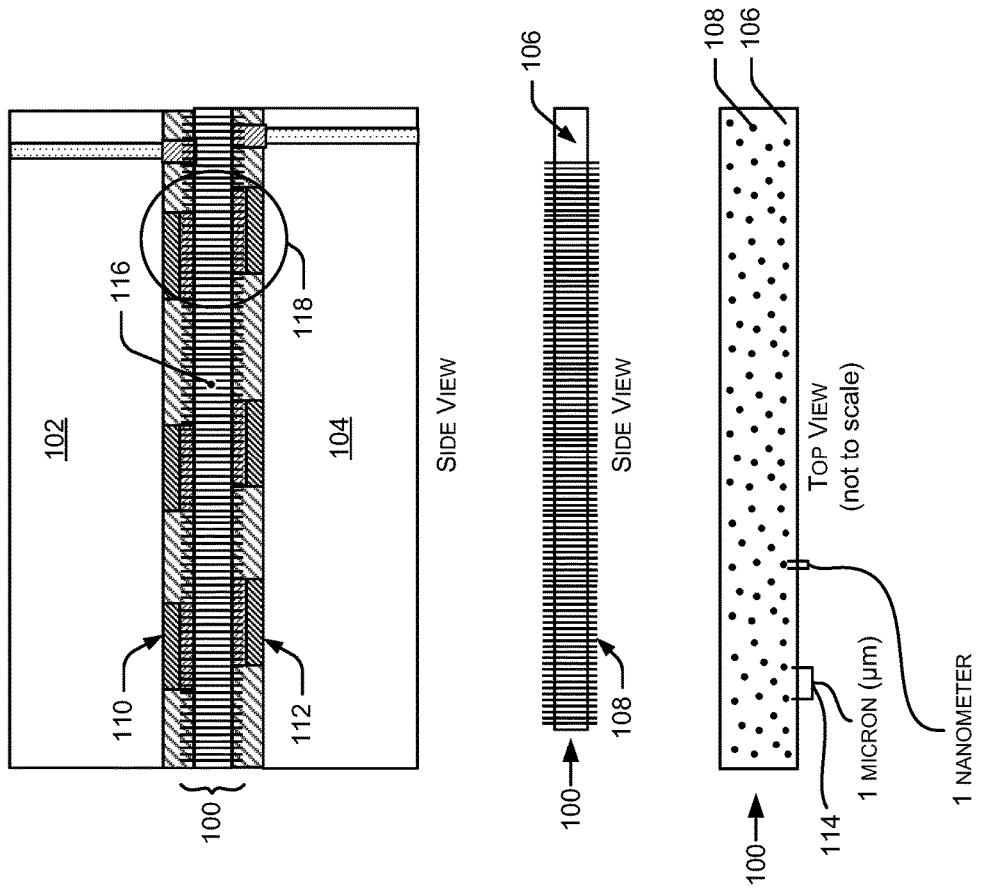
FIG. 1 is a diagram of example microelectronic components joined with an adhesive matrix, the join interface containing aligned conductive members in an adhesive medium.

As shown in FIG. 1, an example adhesive matrix 100, layer, or glue film joins microelectronic components 102 & 104 together in a permanent adhesive bond. The microelectronic components 102 & 104 may be semiconductor wafers, silicon substrates, semiconductor dies, chips, packages, assemblies, dielectrics, or even just surfaces with electrical contacts.

The adhesive matrix 100 includes an electrically nonconductive adhesive medium 106 that hosts conductive members 108, such as carbon nanotubes or densely packed conductive wires. The conductive members 108 are aligned parallel to each other, vertically oriented, and immersed partially or fully in the adhesive medium 106 to provide electrical conduction between pairs of corresponding electrical targets 110 & 112 on the two surfaces that at least partially overlap each other to make contact when joined. The partial overlap of the contacts may be considered partial horizontal overlap as to the horizontal axis or partial vertical alignment as to the vertical axis. Thus, the individual electrical targets 110 & 112 to be electrically connected by the adhesive matrix 100 can be partially misaligned with each other in their vertical alignment.

The conductive members 108 of the adhesive matrix 100, such as carbon nanotubes or densely packed conductive wires, can be evenly dispersed 114 in the nonconductive adhesive medium 106 so that the vertically-running carbon nanotubes or wires are electrically insulated from adjacent conductive members 108 by the adhesive medium 106, thereby making the film or layer of the adhesive matrix 100 horizontally nonconductive.

When applied as a blanket coating or glue layer to bond two microelectronic components 102 & 104 together, the adhesive matrix 100 establishes electrical interconnects between pairs of electrical contacts 110 & 112 that are in at least partial alignment with each other, while conductive members 108 that are not sandwiched (116) between aligned contacts 110 & 112 remain electrically inactive and nonconductive between the two surfaces 102 & 104 being joined. The example adhesive matrix 100 or film is thus an adhesive that provides automatic, self-aligning electrical connections 118 between at least overlapping, partially vertically aligned pairs of contacts 110 & 112 on two surfaces 102 & 104, while providing a nonconductive adhesion between the two surfaces 102 & 104 where there are no electrical connections (116) to be made. Since the adhesive matrix 100 can be flowable during the joining, the adhesive matrix 100 can also conform to contacts and surfaces that may be at various different heights or distances from each other across the interface of the two surfaces 102 & 104 being joined.

In an implementation, a method of joining two microelectronic components includes establishing permanent electrical connections between corresponding but sometimes partially misaligned electrical contacts 110 & 112 of the two microelectronic components 102 & 104 via conductive carbon nanotubes or densely packed aligned wires 108 in an adhesive medium 106, and then securing the two microelectronic components 102 & 104 together with the same adhesive medium 106 that contains the carbon nanotubes or densely packed aligned wires.

The native or onboard electrical contacts 110 & 112 of each microelectronic component 102 & 104 may have a fine pitch. The conductive carbon nanotubes or densely packed aligned wires 108 of the adhesive matrix 100 may have an even finer pitch, for example, averaging approximately one micrometer (µm) or less. In an implementation, the conductive carbon nanotubes or densely packed aligned wires 108 may have an irregular pitch, the irregular pitch still averaging approximately one micrometer (µm) or less, for example.

In most implementations, the adhesive medium 106 in which the conductive members 108 are immersed is nonconductive. Polymeric materials that may be used for the adhesive medium 106 may be of the thermoplastic or thermoset types, although numerous materials may be used that can provide an adhesive holding matrix. Thermoset materials harden as they cross-linked at raised temperatures, while thermoplastics tend to soften as the temperature is raised. The adhesive medium 106 may be an epoxy, for example, or a polyimide, silicone, cyanate ester, acrylic, or other nonconductive polymer.

Whether the selected adhesive medium 106 is a thermoplastic or a thermoset material, the melting and setting temperatures of the respective materials can be important to the particular implementation. For example, with respect to melting temperature, in a particular implementation the adhesive matrix 100 is flowable at a lower temperature than the melting point of solder on electrical contacts, so that the adhesive matrix 100 can be injected between the two surfaces 102 & 104 to be joined without melting the solder. In another implementation, the adhesive matrix 100 is first formed on one of the surfaces 104 to be joined, and it is desirable for the adhesive medium 106 to be substantially solid at the melting point of the solder on the electrical contacts 110, so that the solid adhesive medium 106 can assist in pushing the conductive members 108 into the softened solder for making electrical contact. Thus, with respect to temperatures for setting the adhesive medium 106 when thermoset materials are selected, the setting temperature can be selected to be lower than the melting temperature of the solder, or else the curing can be completed before the surfaces are joined. Both the solder and the thermoset adhesive medium 106 are cooled to room temperature after the surfaces 102 & 104 are permanently joined.

Thermoplastic materials that can be used as the adhesive medium 106 include amorphous polymers, such as imide-based polymers, sulfone-based polymers, and polyarylates, and polymers that are more crystalline, such as ketone-based polymers and polyphenylene sulfides. These thermoplastic materials usually do not need a cure stage, but are used as the adhesive medium 106 by raising their temperature above a particular melting or glass transition temperature value at which the particular material becomes soft. Such thermoplastics may not have the strength that a thermoset material can provide for the bond between surfaces 102 & 104.

Epoxies can be used as the adhesive medium 106, and provide excellent horizontal electrical insulation 114 between the vertically aligned conducting carbon nanotubes or packed wires 108 in the example adhesive matrix 100. The epoxy resins make a good vehicle for aligned carbon nanotubes 108 because of their relatively low viscosity before cure, their fast cure time, low shrinkage, and excellent adhesion to microelectronic surfaces.

In an implementation, depending on application, a polyimide may be used as the adhesive medium 106. Other possible candidates for an adhesive medium 106 for making a conductive adhesive matrix 100 include benzocyclobutene (BCB) and other dielectric insulators, polyurethane elastomers, silicones, poly(phenylene sulfide), poly(para-xylylene), or liquid crystal polyesters. Flow agents or surfactants may be added to facilitate dispersing the adhesive medium 106 around carbon nanotubes or wires 108.

As introduced above, the conductive carbon nanotubes or the conductive wires 108 distributed in the adhesive medium 106 can be at a finer pitch from each other than the numerous conductive contacts, for example contacts 110 & 112, of the two surfaces 102 & 104 to be joined. When the two surfaces of the two respective microelectronic components 102 & 104 are brought together, the surfaces are secured together by the adhesive medium 106. Numerous instances of conductive contacts 110 & 112 of the two surfaces 102 & 104 being joined are electrically connected by the conductive carbon nanotubes or the conductive wires 108 in the adhesive matrix 100 if the respective conductive contacts 110 & 112 happen to both overlap through at least a common vertical line. In other words, the vertically disposed conductive members 108 of the adhesive matrix 100 connect any electrical conductors that their respective ends happen to contact when the surfaces 102 & 104 are brought together.

Each conductive carbon nanotube or conductive wire 108 in the adhesive matrix 100 that does not contact a conductor on both of its ends makes no electrical connection between the two surfaces 102 & 104 being joined and remains a nonconductive part of the adhesive matrix 100. In an implementation, conductive carbon nanotubes 108 that impact a hard surface instead of soft solder simply bend, kink, or break, without making an electrical connection at that spot.

As introduced above, each microelectronic component 102 & 104 to be joined together may be, for example, a semiconductor die, a wafer, a chip, a package, an assembly, a substrate, a piece of silicon, a dielectric, or even just a surface with contacts. The conductive members 108 immersed in the adhesive medium 106 making up the adhesive matrix 100 may be conductive carbon nanotubes or densely packed wires, but may also be coated nanotube wires or microtubules, coated carbon nanotubes, a conductive aligned film of single-walled carbon nanotubes (SWNT), carbon nanotubes with a surfactant outer layer, carbon nanotubes with a dispersant outer layer, carbon nanotubes with a hydrophobic outer layer, carbon nanotubes with a hydrophilic outer layer, copper wires, silver wires, aluminum wires, nickel wires, gold wires, alloy wires, and so forth.

The adhesive matrix 100 containing the vertically aligned conductive members 108, carbon nanotubes, or conducting wires can be constructed, and applied, in various ways between the two surfaces 102 & 104 to be joined.

Figure 2:
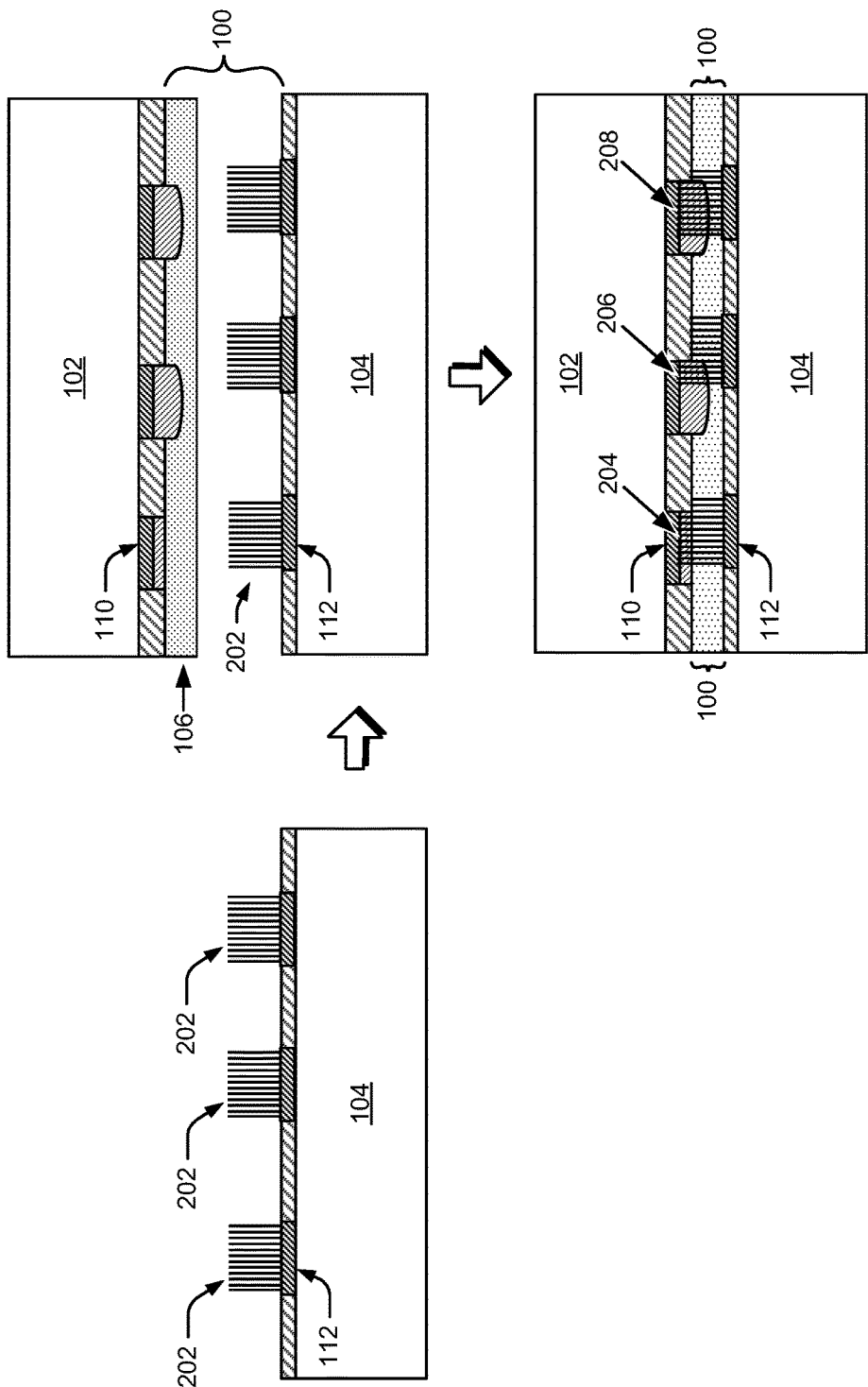
FIG. 2 is a diagram of an example surface-to-surface joining process, in which conductive carbon nanotubes or conductive wires are initially aligned on the conductive contacts of one surface and an adhesive medium is placed on the opposing surface.

FIG. 2 shows an example technique for constructing an example adhesive matrix 100. In an implementation, conductive members 202, such as vertically-aligned carbon nanotubes, a vertically-aligned carbon nanotube film, or packed wires can be applied, placed, or grown directly on a surface, such as a ceramic surface, in the case of carbon nanotubes, or, a metal coated with a catalyst. For example, such a carbon nanotube film 202 can be applied or grown on only one surface of the two microelectronic components 104 to be joined. In an implementation, the carbon nanotube film 202 can be limited to placement or growth only on the electrical conductors 112 on the surface of the microelectronic component 104, for example. In an implementation, the growth temperature of carbon nanotubes is approximately in the range of 600-900° C., so the substrate or microelectronic component 104 must be able to withstand this temperature range when carbon nanotubes 108 are generated in place.

The resulting vertically-aligned carbon nanotube film 202, or layer of packed wires, placed or grown on the conductors 112, has electrical conductivity in the vertical direction but the will be electrically nonconductive in the horizontal plane once the carbon nanotubes 202 or packed wires and the adhesive medium 106 unite. The adhesive medium itself 106 is nonconductive, so the carbon nanotubes 202 or packed wires remain conductive in their aligned vertical direction and conduct vertically, but do not conduct sideways to adjacent carbon nanotubes 202 in the horizontal direction. The adhesive medium 106 maintains the vertical alignment of the carbon nanotubes 202 or packed wires, without causing or allowing a significant number of the carbon nanotubes 202 or packed wires to turn sideways or lose alignment, and the adhesive medium 106 also prevents the carbon nanotubes 202 or packed wires from clumping together.

In the implementation of FIG. 2, the conductive members 202, such carbon nanotubes or conductive wires, are initially applied or grown only on the conductive contacts 112 of one of the surfaces 104 to be joined, and the adhesive medium 106, which initially has no conductive carbon nanotubes 202 or conductive packed wires, is placed on the other surface 102. The two surfaces 102 & 104 are then joined to constitute the adhesive matrix 100 and form an adhesive bond between the two microelectronic components 102 & 104. The joining automatically establishes electrical interconnects 204 & 206 & 208 between respective vertically aligned parts of the conductive contacts 110 & 112 of the respective surfaces 102 & 104, even though the conductive contacts 110 & 112 may be substantially misaligned with respect to each other.

Figure 3:
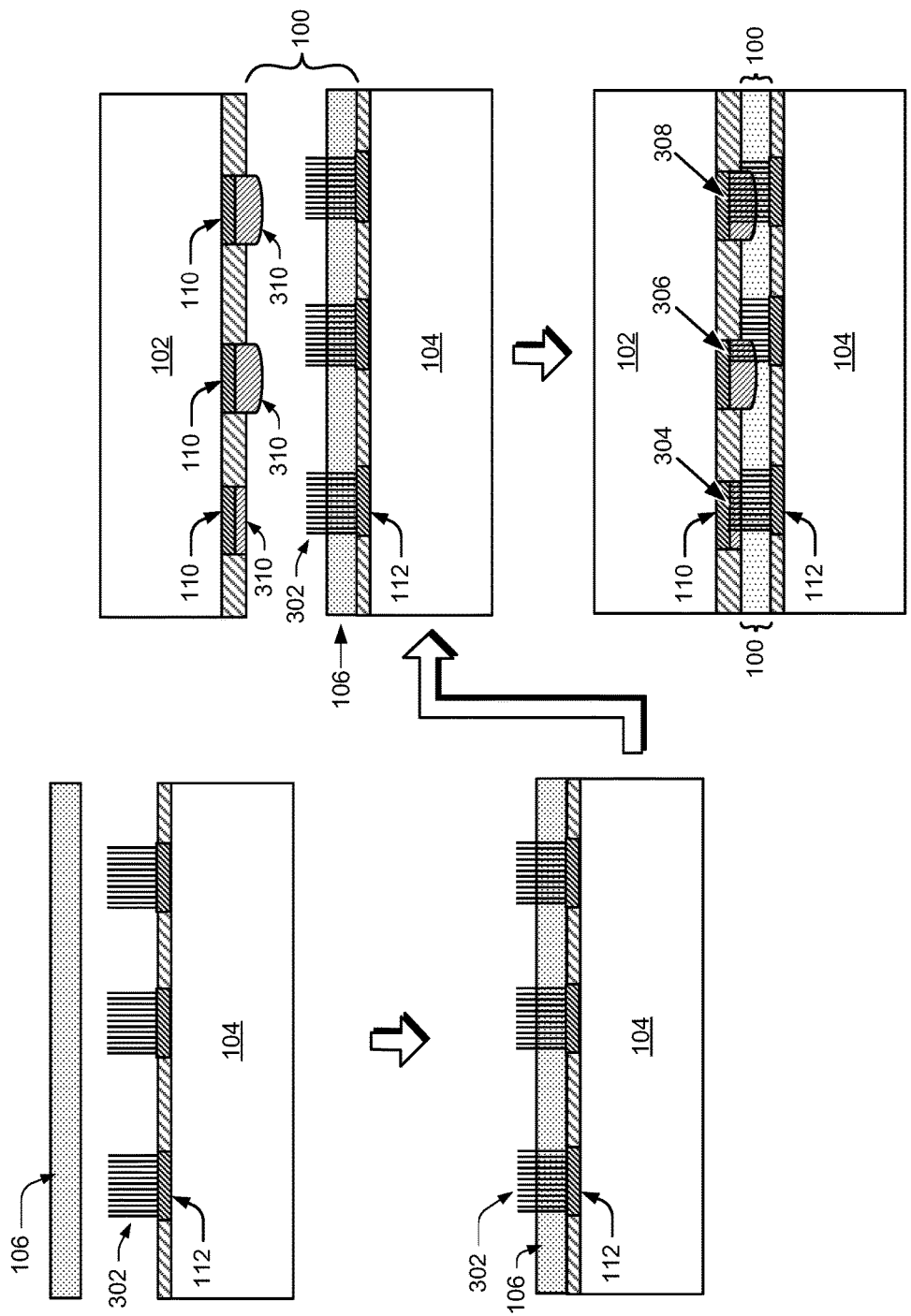
FIG. 3 is a diagram of an example surface-to-surface joining process, in which conductive carbon nanotubes or conductive wires are initially aligned on the conductive contacts of one surface while an adhesive medium is initially provided on the same surface.

FIG. 3 shows another example technique for constructing an example adhesive matrix 100. In this implementation, the conductive carbon nanotubes 302 or conductive wires are placed or grown only on the conductive contacts 112 of one surface 104 of the two surfaces to be joined, and the adhesive medium 106 is added to this same surface 104. The two surfaces of the two microelectronic components 102 & 104 are then joined to establish an adhesive bond between the two microelectronic components 102 & 104 and to establish electrical connections 304 & 306 & 308 between the at least partly aligned conductive contacts 110 & 112 of the respective surfaces 102 & 104.

A joining material, such as a solder 310, may be added to the electrical contacts 110 of the surface 102 receiving the ends of the carbon nanotubes 302 or packed wires, when the carbon nanotubes 302 or packed wires are initially assembled on one surface 104 of the two surfaces 102 & 104. As introduced above, whether the selected adhesive medium 106 is a thermoplastic or a thermoset material, the melting or setting temperature of the selected adhesive medium 106 can be important to the particular implementation. In FIG. 3, since the adhesive matrix 100 is first formed on one of the surfaces 104 to be joined, when a thermoplastic material is used as the adhesive medium 106, it may be desirable to maintain the thermoplastic-based adhesive matrix 100 in a solid state until the solder 310 softens or melts, to act as physical support so that the carbon nanotubes 302 or packed wires can be firmly pushed into the solder 310 to contact and bond with the solder 310. In this case, it may be beneficial for a thermoplastic adhesive medium 106 to remain substantially solid until a slightly higher temperature than the melting point of the solder 310 on the electrical contacts 110.

In an implementation using a thermoset material for the adhesive medium 106, the thermoset-based adhesive medium 106 may be selected to have a setting or curing temperature that is slightly higher or lower than the melting temperature of the solder 310, depending on how much stiffness, viscosity, or physical support is expected from the adhesive medium 106 for pushing the carbon nanotubes 302 or packed wires into softened solder 310. After permanently joining the two surfaces 102 & 104, the joined package including the two microelectronic components 102 & 104, the solder 310, and the adhesive matrix 100 are allowed to cool to room temperature.

Figure 4:
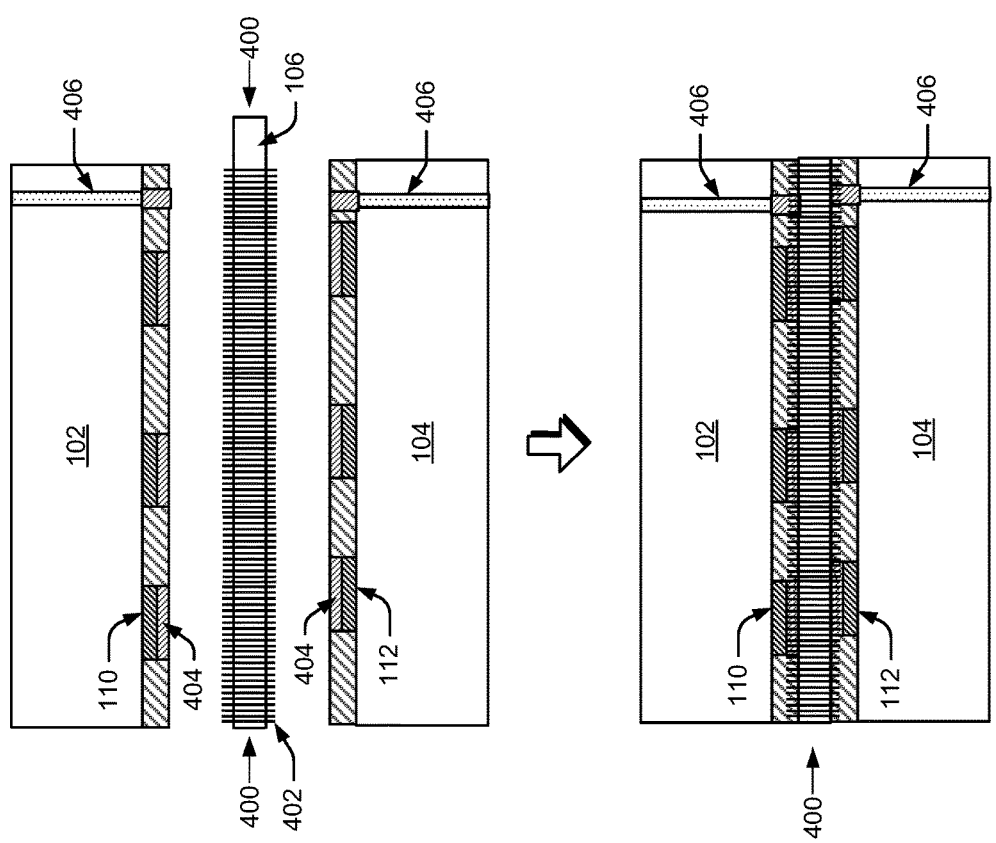
FIG. 4 is a diagram of an example surface-to-surface joining process, in which a standalone adhesive matrix is separately constructed and then placed between two surfaces of the microelectronic components to be joined.
Figure 5:
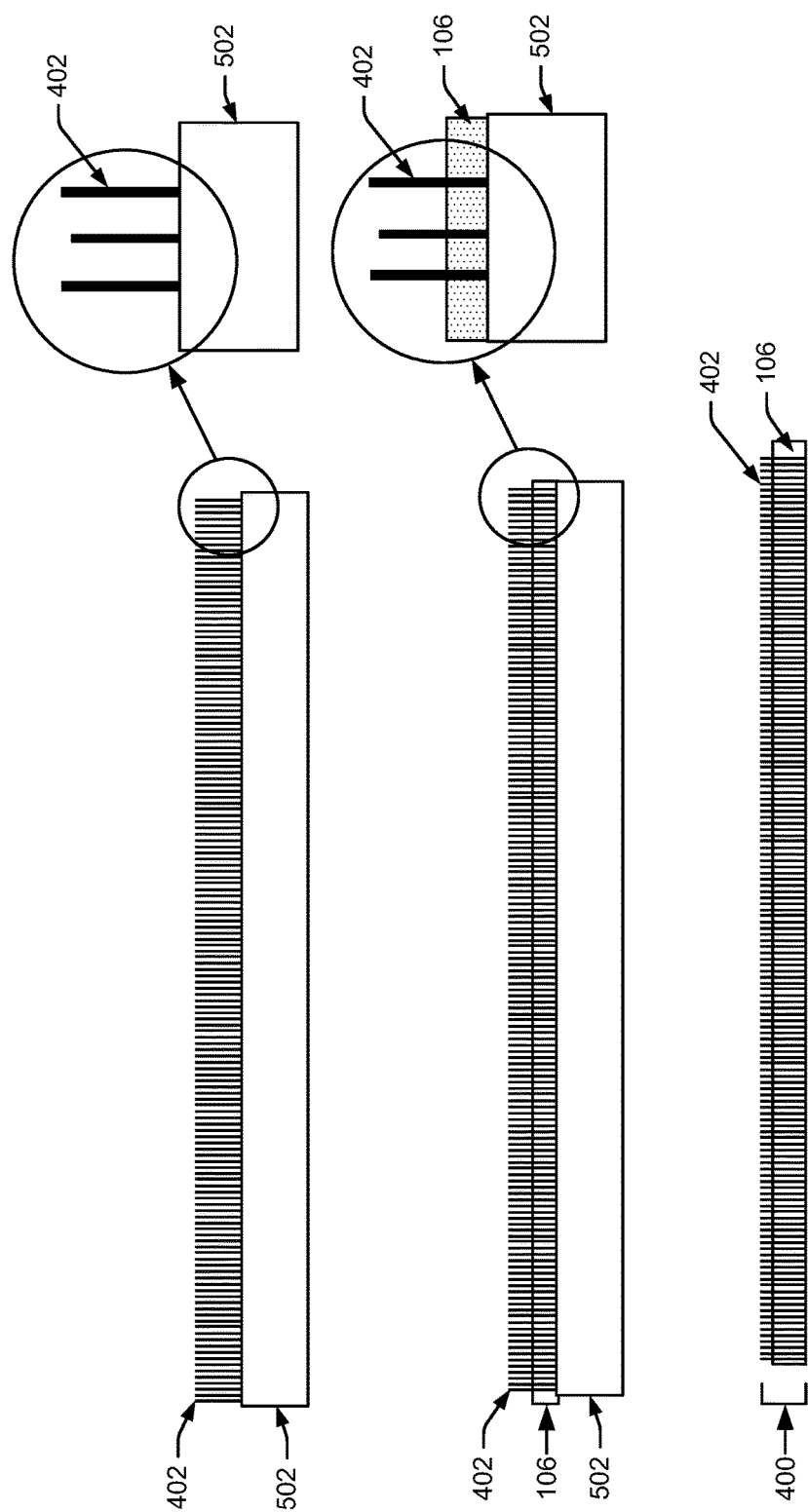
FIG. 5 is a diagram of a first example process for making a standalone adhesive matrix.
Figure 6:
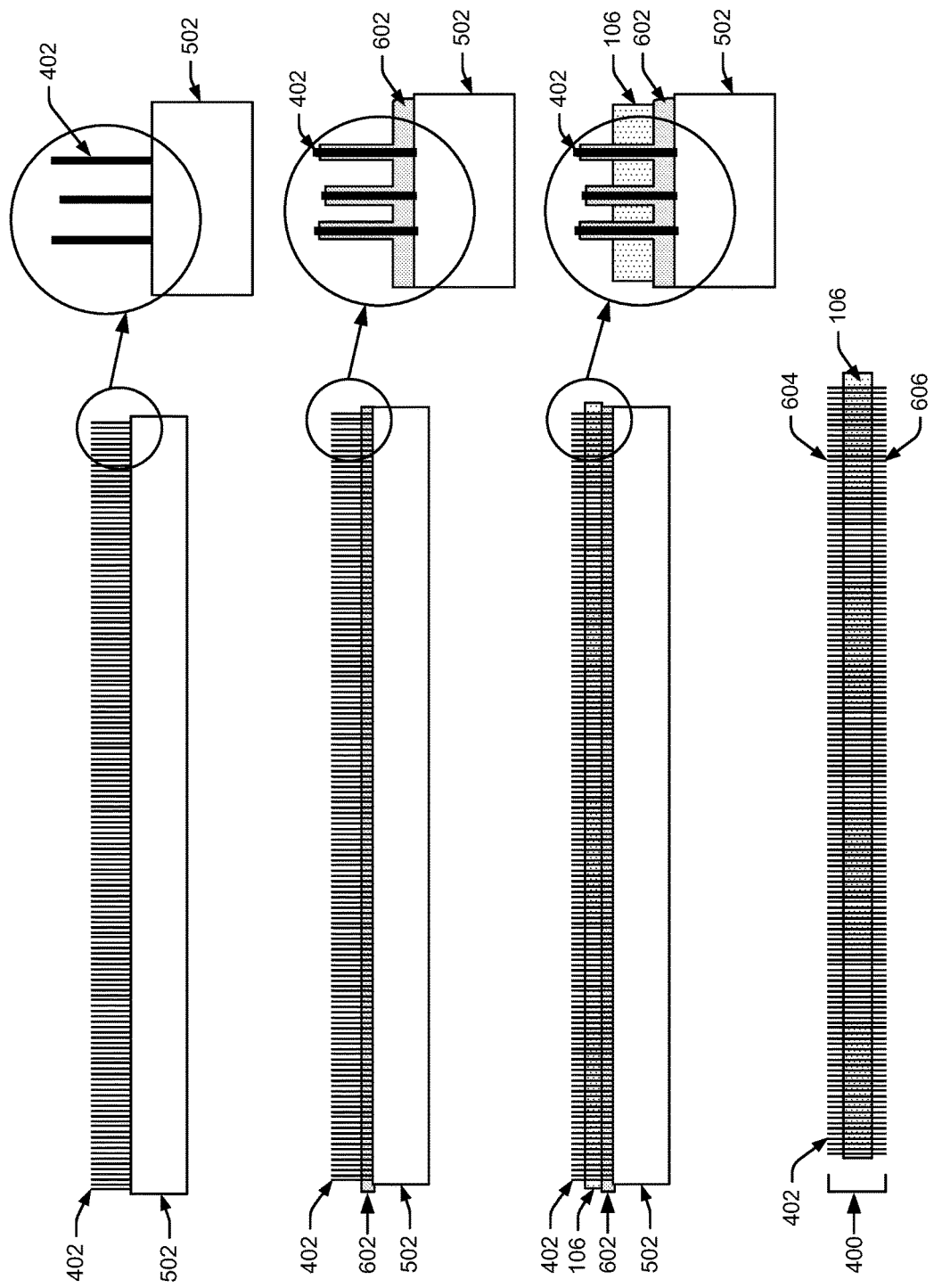
FIG. 6 is a diagram of a second example process for making a standalone adhesive matrix.

FIG. 4 shows example techniques for joining components using a standalone adhesive matrix 400 or "joining structure" that may be placed as a layer or injected between surfaces 102 & 104 to automatically make electrical interconnects between the surfaces and bond the surfaces 102 & 104 together. The standalone adhesive matrix 100, as described further below with respect to FIG. 5 and FIG. 6, is made by aligning conductive carbon nanotubes 402, for example, on a standalone substrate. Then an adhesive medium 106 is added to make a film, paste, gel, fill, matrix, molding, joining structure, or layer on the substrate. The substrate is removed, leaving a layer or fill that can then be applied between the surfaces 102 & 104 to be joined.

In an implementation, conductive carbon nanotubes 402 can be wetted to modify a hydrophobia or a hydrophilia of the outer surfaces of the conductive carbon nanotubes 402, and/or to self-align the conductive carbon nanotubes 402 in the adhesive medium 106. The wettability of the conductive carbon nanotubes 402 can be selected to variously enhance their performance both in anisotropic self-alignment and in distributive spacing with respect to each other, within the polymeric adhesive matrix 100, but also with respect to their physical interaction and synergy with the adhesive medium 106 itself. The presence of the carbon nanotubes 402 changes, and ideally enhances, the physical properties of the overall carbon-nanotube-and-adhesive-medium matrix 100 to be applied as a flowable layer, for example. A compatible surfactant, for example, can assist the flowability or improve the viscosity of the hosting adhesive medium.

In an implementation, instead of the conductive carbon nanotubes 402, coated carbon nanotube wires may be used instead, for example. If densely packed conductive wires or micro-wires are used, the wires may be copper, silver, aluminum, nickel, gold, or an alloy, for example.

In an implementation, the conductive contacts 110 & 112 of at least one of the surfaces 102 & 104 may be coated with a flowable joining material, such as a solder 404. In an example method, heat and/or pressure may be applied to cause the solder 404 or other flowable joining material on the conductive contacts 110 & 112 to flow first, before the adhesive medium 106 that will adhere the two surfaces 102 & 104 together begins to flow. To assist coating the conductive contacts 110 & 112 with the solder 404 or flowable joining material before the join, the conductive contacts 110 & 112 of the surfaces 102 & 104 may be planarized or manufactured flat with respect to each other. The conductive contacts 110 & 112 may include connections to through-silicon-vias (TSVs) 406 or other conductive features that may be automatically connected together across the interface with the self-connecting interconnects provided by the adhesive matrix 400.

In an implementation, an example method includes heating the microelectronic components 102 & 104 under vacuum, for example in a vacuum chamber, to soften at least the joining material, such as solder 404, while conductive members, such as carbon nanotubes 402 or densely packed conductive wires get pressed into the softened solder 404 or joining material. The vacuum chamber is then pressurized to make the adhesive medium 106 flow, securing the two surfaces 102 & 104 together, while also establishing electrical contact between the respective electrical contacts 110 & 112 via the conductive carbon nanotubes 402 or the densely packed conductive wires.

When solder 404 or a joining material is used on all electrical contacts 110 & 112, then the conductive carbon nanotubes 402 or the conductive wires that are not disposed between solder 404 or between softened joining material are intended to bend, kink, or break upon engaging the harder surfaces that are not the electrical contacts 110 & 112, thereby making no electrical connection between the two surfaces 102 & 104 at places where there should not be an electrical connection or electrical conduction.

FIG. 5 shows an example technique for making the standalone adhesive matrix 100, or joining structure, of FIG. 4. In an implementation, carbon nanotubes 402 or aligned coated wires are assembled on a separate standalone substrate 502. The adhesive medium 106 is applied or flowed into the aligned carbon nanotubes 402 or the aligned coated wires, down to the surface of the standalone substrate 502 in order to make the adhesive matrix 100. The substrate 502 is removed or released from the adhesive matrix 100 to reveal a freestanding adhesive matrix 100 with the ends of the carbon nanotubes 402 or coated wires flush with one side of the layer of adhesive medium 106. This implementation of the freestanding adhesive matrix 100 is useful for a surface 104 with electric contacts 110 & 112 that are low or flush with the surface 104. The adhesive matrix 100 can then be placed between the two surfaces 102 & 104 to be joined.

FIG. 6 shows another example technique for making the freestanding adhesive matrix 100, or joining structure, of FIG. 4. In an implementation, carbon nanotubes 402 or aligned coated wires are assembled on a separate standalone substrate 502. A fill layer 602 or a release layer is added on the standalone substrate 502 where the aligned carbon nanotubes 402 or the aligned coated wires attach to the substrate 502. An adhesive medium 106 is then applied or flowed into the aligned carbon nanotubes 402 or the aligned coated wires, down to a top surface of the fill layer 602 or release layer, in order to constitute the adhesive matrix 100. The substrate 502 is then removed or released from the adhesive matrix 100 to reveal a standalone adhesive matrix 100 with both ends 604 & 606 of the aligned carbon nanotubes 402 or aligned coated wires free of the adhesive medium 106, in order to penetrate a solder 404 or for connecting with the electrical contacts 110 & 112. The adhesive matrix 100 can then be placed between the two surfaces 102 & 104 to be joined.

The conductive members 108 or 302 or 402, such as conductive carbon nanotubes or conductive wires may also be used to dissipate heat from at least one of the two components being joined. The thermal conductivity of vertically aligned carbon nanotubes 402, for example, can exceed by at least an order of magnitude the thermal conductivity of well-known thermal greases or other well-known materials that undergo change-of-phase to dissipate heat. Thus, one end of the carbon nanotubes 402 or conductive wires can make thermally conductive contact with an electrical contact 110 & 112 or other heat-conducting surface of a microelectronic component or surface 102 & 104, and thermally transmit the heat away to a larger volume metal sink or to an external dissipative feature, such as micro-fins, external heat sink, or heat dissipater.

Example Methods

Figure 7:
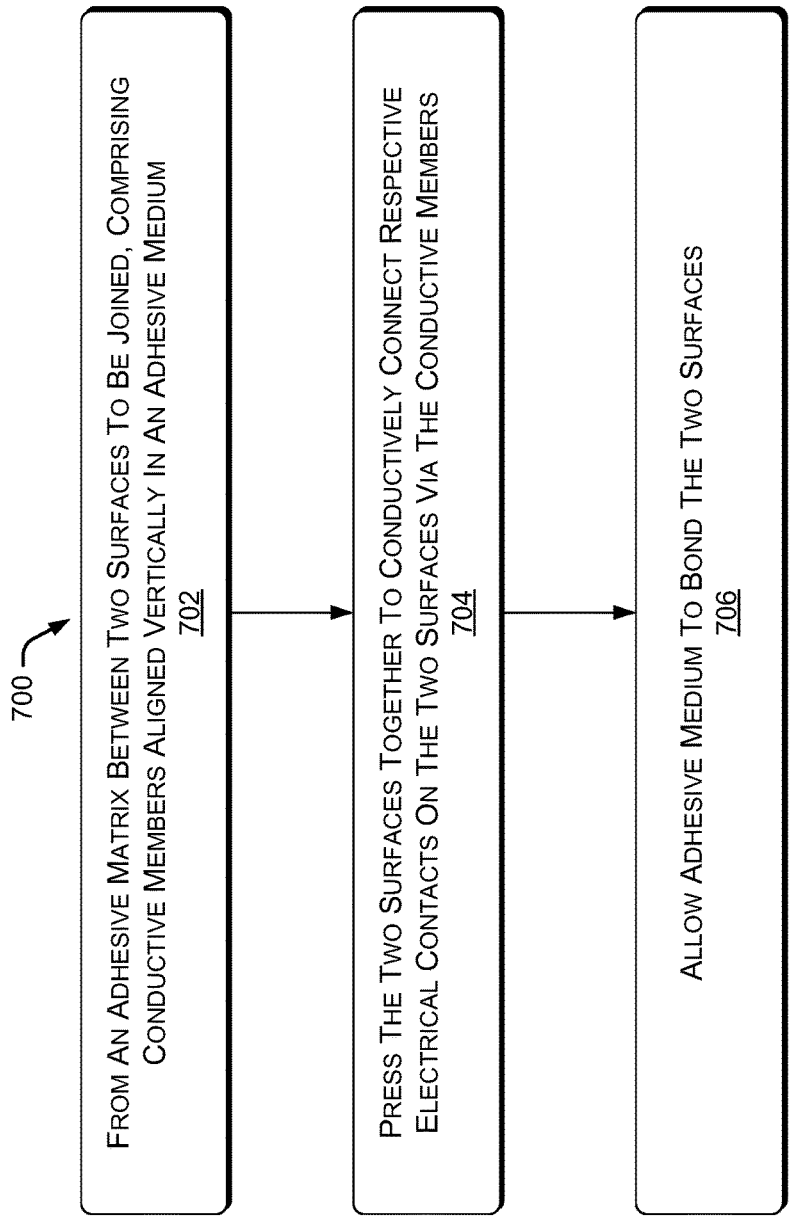
FIG. 7 is a flow diagram of an example method of joining microelectronic components.

FIG. 7 shows an example method 700 of joining microelectronic components. In the flow diagram of FIG. 7, operations of the example method 700 are shown in individual blocks.

At block 702, an adhesive matrix is formed between two surfaces to be joined, the adhesive matrix comprising conductive members aligned vertically in an adhesive medium.

At block 704, the two surfaces are pressed together to conductively connect respective electrical contacts on the two surfaces via the conductive members in the adhesive matrix, the respective electrical contacts at least partially aligned with each other along a vertical line.

At block 706, the two surfaces are secured together with the adhesive medium contained within the adhesive matrix.

Pressing the two surfaces together can comprise conductively connecting misaligned electrical contacts of the two surfaces via the conductive members of the adhesive matrix. Corresponding parts of the two surfaces, where no electrical contacts are located, are nonconductively adhered together via the adhesive medium within the adhesive matrix.

The adhesive matrix may provide aligned conductive members with a pitch averaging approximately 1 micrometer ($\mu$m) or less from each other, and the adhesive medium electrically insulates the vertically aligned conductive members from horizontal electrical conduction between each other.

The conductive members may be carbon nanotubes, densely packed conductive wires, coated carbon nanotubes, a conductive aligned film of single-walled carbon nanotubes (SWNT), carbon nanotubes with a surfactant outer layer, carbon nanotubes with a dispersant outer layer, carbon nanotubes with a hydrophobic outer layer, carbon nanotubes with a hydrophilic outer layer, copper wires, silver wires, aluminum wires, nickel wires, gold wires, or alloy wires, for example.

Figure 8:
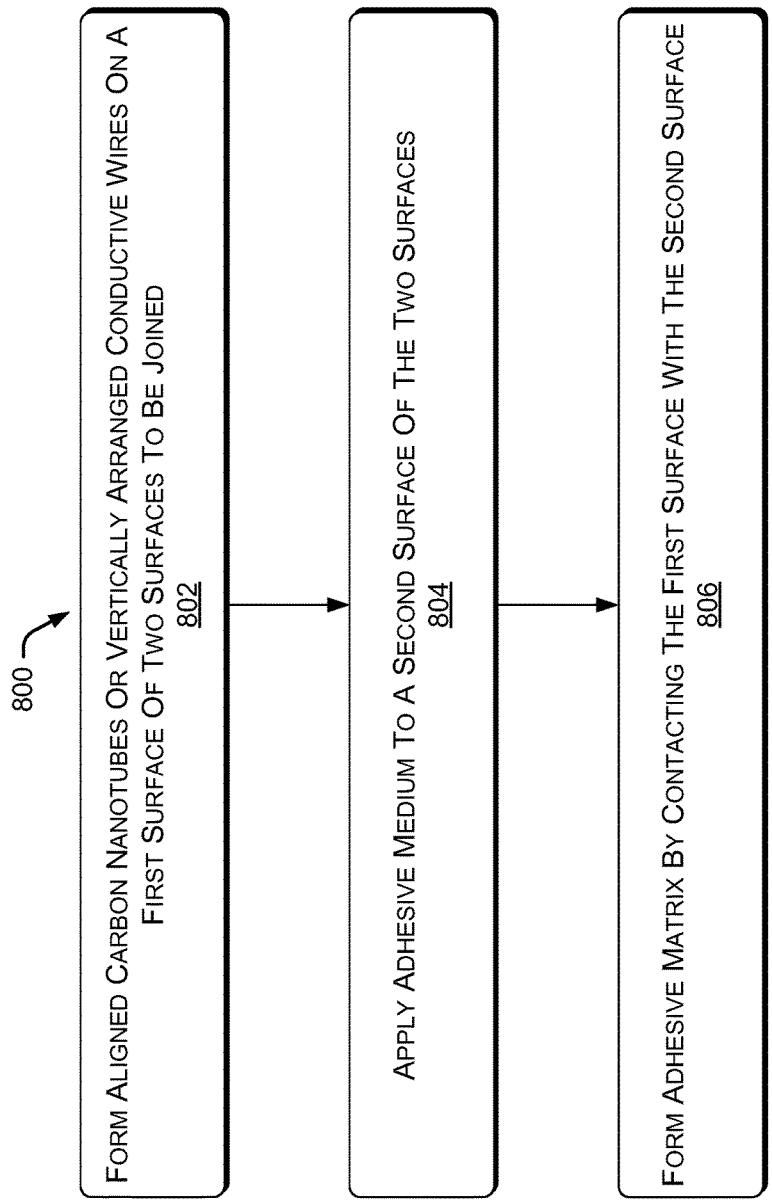
FIG. 8 is a flow diagram of an example method of constructing an adhesive matrix on surfaces to be joined.

FIG. 8 shows an example method 800 of constructing an adhesive matrix on surfaces to be joined. In the flow diagram of FIG. 8, operations of the example method 800 are shown in individual blocks.

At block 802, aligned carbon nanotubes or vertically arranged conductive wires are formed on a first surface of two surfaces to be joined.

At block 804, an adhesive medium is applied to a second surface of the two surfaces.

At block 806, the adhesive matrix is formed by contacting the first surface and the second surface together.

The aligned carbon nanotubes or vertically arranged conductive wires may be formed only on the electrical contacts of the respective surface. In an implementation, carbon nanotubes are grown only on the metal of the electrical contacts that need to connect to the other surface through the adhesive matrix.

Figure 9:
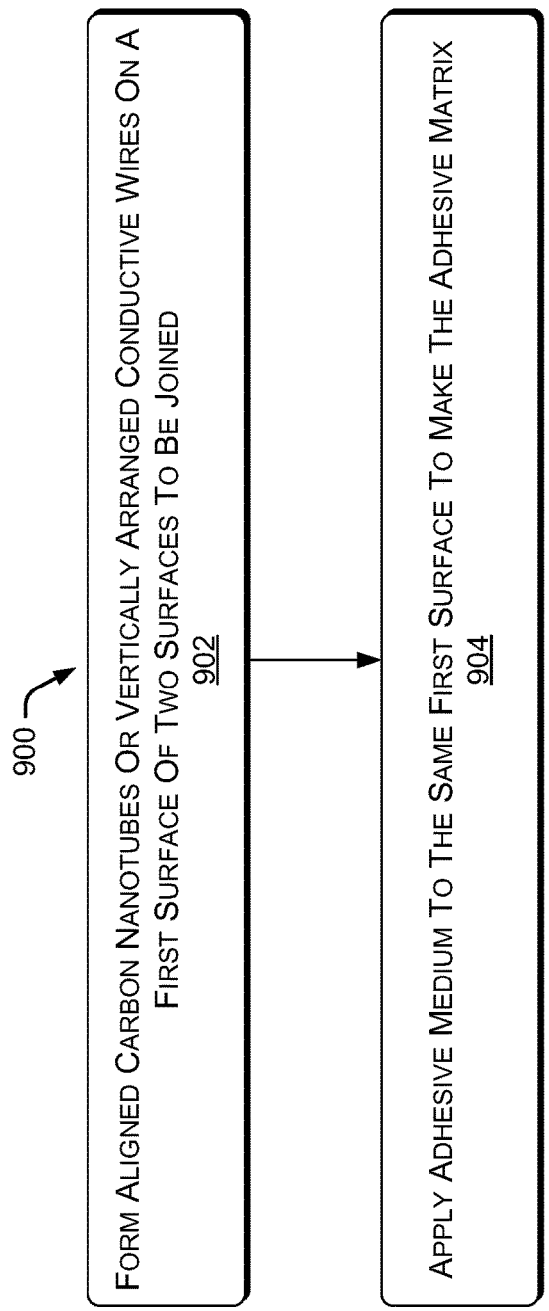
FIG. 9 is a flow diagram of another example method of constructing an adhesive matrix on surfaces to be joined.

FIG. 9 shows another example method 900 of constructing an adhesive matrix on surfaces to be joined. In the flow diagram of FIG. 9, operations of the example method 900 are shown in individual blocks.

At block 902, aligned carbon nanotubes or vertically arranged conductive wires are formed on a first surface of two surfaces to be joined.

At block 904, an adhesive medium is applied to the same first surface to make the adhesive matrix 100.

The first surface and the second surface can then be joined together.

The aligned carbon nanotubes or vertically arranged conductive wires may be formed only on the electrical contacts of the respective surface. In an implementation, carbon nanotubes are grown only on the metal of the electrical contacts that need to connect to the other surface through the adhesive matrix.

Figure 10:
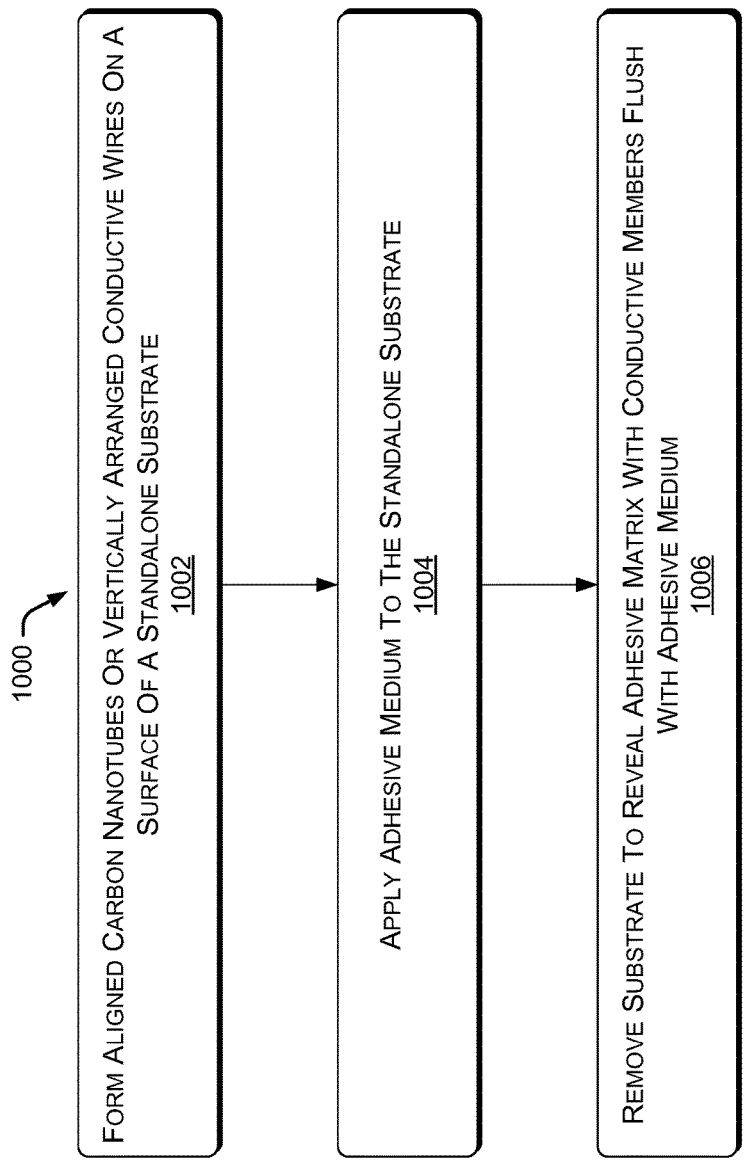
FIG. 10 is a flow diagram of an example method of constructing a standalone adhesive matrix to be placed between two surfaces, to physically adhere and electrically connect the two surfaces.

FIG. 10 shows an example method 1000 of constructing a standalone adhesive matrix to be placed between two surfaces for automatically connecting electrical contacts on the two surfaces, and bonding the two surfaces together. In the flow diagram of FIG. 10, operations of the example method 1000 are shown in individual blocks.

At block 1002, aligned carbon nanotubes or aligned coated wires are formed or placed on a surface of a standalone substrate.

At block 1004, an adhesive medium is added into the aligned carbon nanotubes or the aligned coated wires at least at the surface of the standalone substrate, to make a layer of the adhesive medium.

At block 1006, the substrate is removed from the adhesive matrix to reveal a freestanding adhesive matrix with the aligned carbon nanotubes or aligned coated wires flush with one surface of the layer of the adhesive medium.

The adhesive matrix can then be placed between the two surfaces to be joined.

Figure 11:
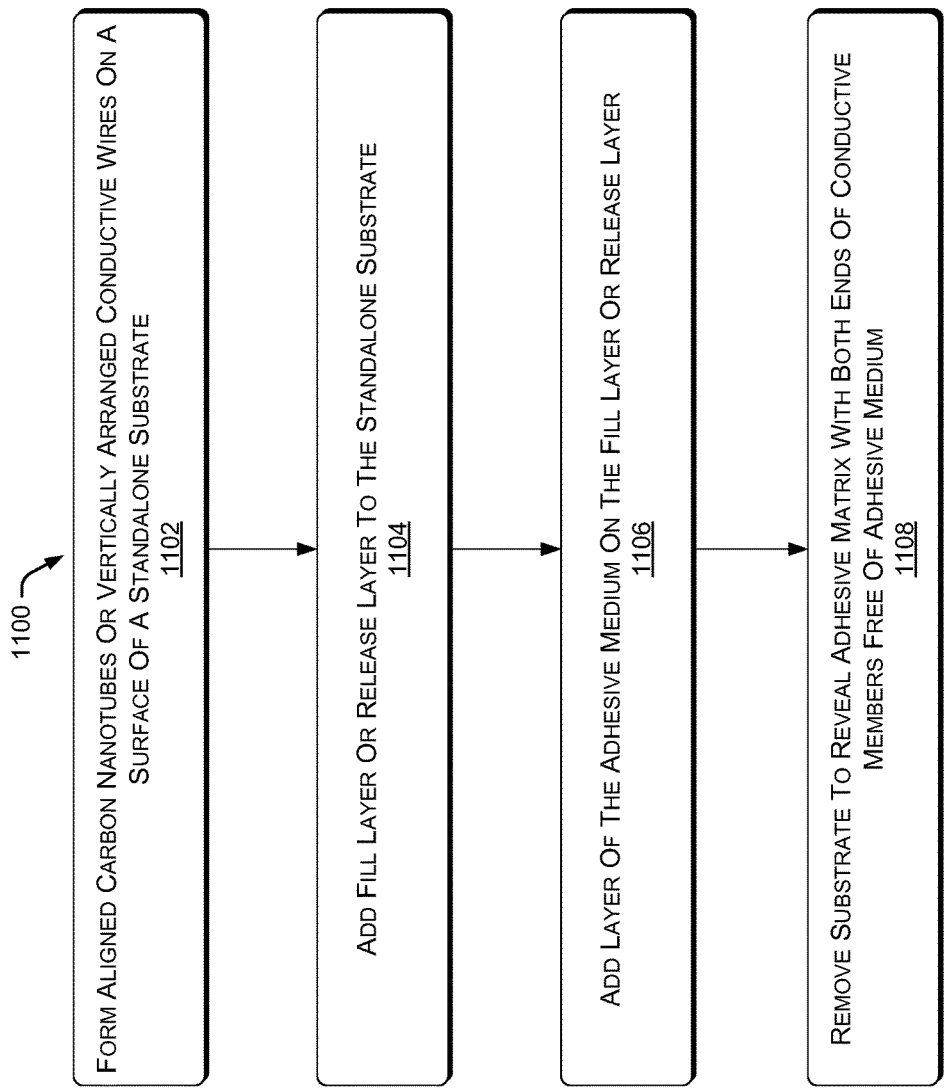
FIG. 11 is a flow diagram of another example method of constructing a standalone adhesive matrix to be placed between two surfaces, to physically adhere and electrically connect the two surfaces.

FIG. 11 shows an example method 1100 of constructing a standalone adhesive matrix to be placed between two surfaces for automatically connecting electrical contacts on the two surfaces and bonding the two surfaces together. In the flow diagram of FIG. 11, operations of the example method 1100 are shown in individual blocks.

At block 1102, aligned carbon nanotubes or aligned coated wires are placed or formed on a surface of a standalone substrate.

At block 1104, a fill layer or a release layer is added to the aligned carbon nanotubes or aligned coated wires at the surface of the standalone substrate where the aligned carbon nanotubes or the aligned coated wires attach to the surface of the substrate.

At block 1106, an adhesive medium is added into the aligned carbon nanotubes or the aligned coated wires down to a top surface of the fill layer or release layer, to form a layer of the adhesive medium.

At block 1108, the fill layer or release layer and the substrate are removed from the adhesive matrix to reveal a standalone adhesive matrix with the aligned carbon nanotubes or aligned coated wires free of the adhesive medium, in order to penetrate into a solder or for connecting with the electrical contacts.

The standalone adhesive matrix may be placed between the two surfaces to be joined.

Figure 12:
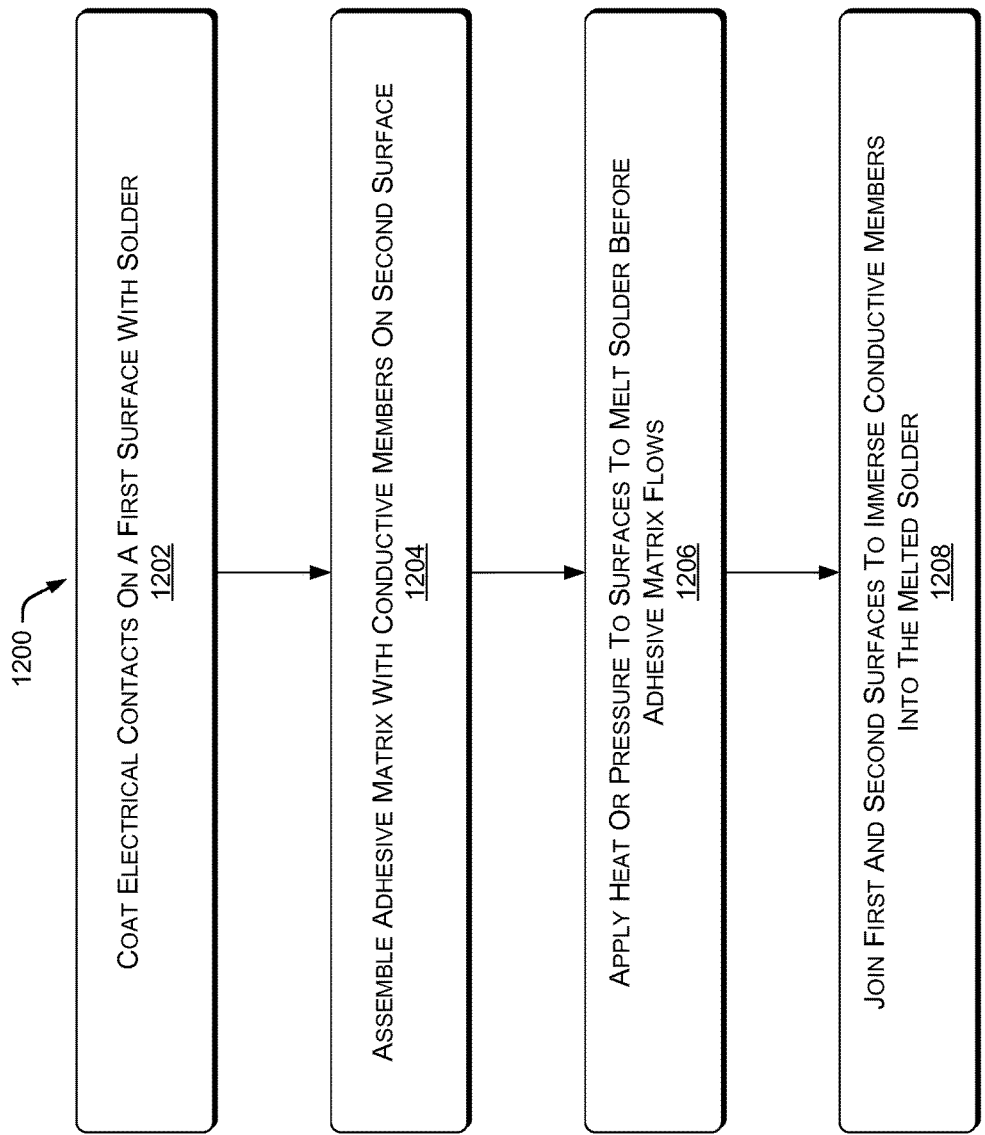
FIG. 12 is a flow diagram of an example method of joining two microelectronic surfaces with an adhesive matrix that makes vertical electrical connections across the join interface.

FIG. 12 shows an example method 1200 of joining two microelectronic surfaces with an adhesive matrix that makes vertical electrical connections across the join interface. In the flow diagram of FIG. 12, operations of the example method 1200 are shown in individual blocks.

At block 1202, electrical contacts on a first surface of the two surfaces are coated with a solder or joining material having a melting temperature.

At block 1204, an adhesive matrix with anisotropic conductive members is assembled on a second surface of the two surfaces, wherein the adhesive matrix has a melting temperature or a glass transition temperature higher than the melting temperature of the solder or joining material.

At block 1206, heat or pressure is applied to the two surfaces to melt or soften the solder or flowable joining material before the adhesive matrix melts or flows.

At block 1208, the two surfaces are brought together immersing conductive members of the adhesive matrix into the melted solder or melted joining material.

The surfaces may now be raised to a higher temperature to cause the adhesive medium of the adhesive matrix to flow to adhere surfaces together.

Figure 13:
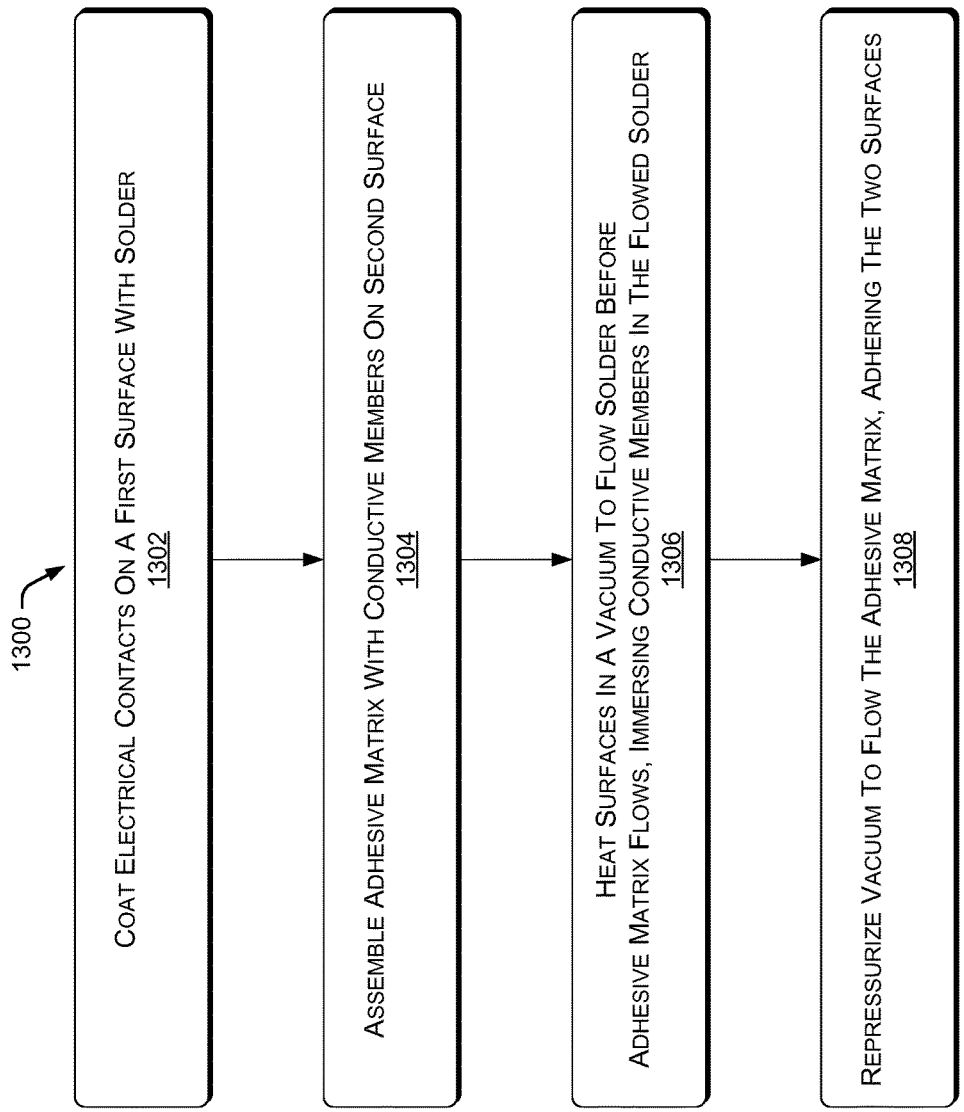
FIG. 13 is a flow diagram of another example method of joining two microelectronic surfaces with an adhesive matrix that makes vertical electrical connections across the join interface.

FIG. 13 shows another example method 1300 of joining two microelectronic surfaces with an adhesive matrix that automatically makes vertical electrical connections across the join interface. In the flow diagram of FIG. 13, operations of the example method 1300 are shown in individual blocks.

At block 1302, electrical contacts on a first surface of the two surfaces are coated with a solder or joining material having a melting temperature.

At block 1304, an adhesive matrix with anisotropic conductive members is assembled on a second surface of the two surfaces, wherein the adhesive matrix has a melting temperature or a glass transition temperature higher than the melting temperature of the solder or joining material.

At block 1306, the microelectronic surfaces are heated under vacuum, for example in a chamber, to at least soften the solder or joining material while the conductive members are pressed into the solder or joining material.

At block 1308, the chamber is repressurized to cause the adhesive matrix to flow for adhesively joining the two surfaces.

While the present disclosure has been disclosed with respect to a limited number of embodiments, those skilled in the art, having the benefit of this disclosure, will appreciate numerous modifications and variations there from. It is intended that the appended claims cover such modifications and variations as fall within the true spirit and scope of the disclosure.

The invention claimed is:

1. A self-adjusting adhesive containing self-connecting interconnects, comprising:
    an adhesive medium capable of solidifying into a permanent adhesive between surfaces;
    conductive members aligned vertically in the adhesive medium with a pitch averaging approximately 1 micrometer (µm) or less from each other, the adhesive medium electrically insulating the vertically aligned conductive members from horizontal electrical conduction between each other; and
    wherein the conductive members are configured to penetrate into a solder when the conductive members are vertically aligned with the solder on one of the surfaces while configured at the same time to bend, kink, or break upon engaging a nonconductive part of one of the surfaces.

2. The adhesive of claim 1, wherein the adhesive medium comprises a flowable medium.

3. The adhesive of claim 1, further comprising anisotropically aligned conductive members.

4. The adhesive of claim 1, further comprising automatically formed electrical interconnects between opposing electrical contacts at least partially vertically aligned on each of two respective surfaces being adhered together, the automatically formed electrical interconnects comprising sets of the conductive members aligned vertically.

5. The adhesive of claim 4, further comprising automatically formed electrical interconnects between misaligned opposing electrical contacts.

6. The adhesive of claim 1, further comprising electrically nonconductive adhesive between parts of the surfaces lacking at least partially aligned electrical contacts, the electrically nonconductive adhesive comprising sets of the conductive members aligned vertically in the adhesive medium.

7. The adhesive of claim 1, wherein the conductive members are selected from the group consisting of carbon nanotubes, densely packed conductive wires, coated carbon nanotubes, a conductive aligned film of single-walled carbon nanotubes (SWNT), carbon nanotubes with a surfactant outer layer, carbon nanotubes with a dispersant outer layer, carbon nanotubes with a hydrophobic outer layer, carbon nanotubes with a hydrophilic outer layer, copper wires, silver wires, aluminum wires, nickel wires, gold wires, and alloy wires.

8. The adhesive of claim 1, further comprising conductive members with first ends and second ends, wherein at least the first ends or the second ends of the conductive members are flush with a surface of a layer of the adhesive.

9. The adhesive of claim 1, further comprising a release layer, the adhesive capable of being applied to a surface with the release layer, prior to the release layer being removed from the adhesive.

10. The adhesive of claim 1, wherein the conductive members are capable of penetrating into a solder of an electrical contact on a surface.

11. The adhesive of claim 10, wherein the adhesive medium comprises a solid thermoplastic material having a melting temperature or a glass transition temperature higher than the melting temperature of the solder.

12. The adhesive of claim 10, wherein the adhesive medium comprises a thermoset material having a curing temperature or a setting temperature lower than the melting temperature of the solder.

13. The adhesive of claim 10, wherein the adhesive medium comprises a thermoset material having a curing temperature or a setting temperature higher than the melting temperature of the solder, and the thermoset material is capable of being cured prior to joining two surfaces being adhered with the adhesive.

14. The adhesive of claim 1, wherein the conductive members are configured to penetrate into the solder and capable of bending, kinking, or breaking upon engaging a nonconductive part of a surface being adhered by the adhesive only at a temperature higher than a setting temperature of the adhesive.

15. The adhesive of claim 1, wherein the adhesive medium and the conductive members are capable of transmitting a heat or a pressure during application to cause a solder or a flowable joining material coating electrical contacts of surfaces being joined to flow before the adhesive medium flows.

16. The adhesive of claim 1, wherein the adhesive medium is capable of softening and flowing under a vacuum while the conductive members connect the vertically corresponding electrical contacts of two surfaces being adhered together.

17. The adhesive of claim 1, wherein the conductive members are capable of complying to variances in distances between parts of two surfaces being adhered by the adhesive.

18. The adhesive of claim 17, wherein the conductive members compliantly establish electrical connections between at least partially aligned contacts at various distances apart from each other on each of the two respective surfaces.

19. The adhesive of claim 17, wherein the adhesive medium provides compliant nonconductive adhesion between nonelectrical parts of the two surfaces at various distances apart from each other.

20. The adhesive of claim 1, wherein the conductive members dissipate a heat away from at least one surface being adhered by the adhesive.

* * * * *